United States Patent
Hasegawa et al.

(10) Patent No.: US 8,899,247 B2
(45) Date of Patent: Dec. 2, 2014

(54) ULTRASONIC CLEANING APPARATUS

(75) Inventors: Hiroshi Hasegawa, Tokyo (JP);
Tomoharu Kamamura, Tokyo (JP)

(73) Assignee: Kaijo Corporation, Tokyo (JP)

( * ) Notice: Subject to any disclaimer, the term of this patent is extended or adjusted under 35 U.S.C. 154(b) by 1253 days.

(21) Appl. No.: 12/225,760

(22) PCT Filed: Sep. 10, 2007

(86) PCT No.: PCT/JP2007/067581
§ 371 (c)(1),
(2), (4) Date: May 27, 2010

(87) PCT Pub. No.: WO2008/035581
PCT Pub. Date: Mar. 27, 2008

(65) Prior Publication Data
US 2011/0079253 A1    Apr. 7, 2011

(30) Foreign Application Priority Data

Sep. 22, 2006   (JP) .................................. 2006-257411

(51) Int. Cl.
| | |
|---|---|
| *B06B 1/02* | (2006.01) |
| *B08B 3/04* | (2006.01) |
| *B08B 3/10* | (2006.01) |
| *B08B 3/12* | (2006.01) |
| *H01L 21/67* | (2006.01) |
| *H01L 41/09* | (2006.01) |

(52) U.S. Cl.
CPC ........ *B06B 1/0238* (2013.01); *H01L 21/67057* (2013.01); *B08B 3/12* (2013.01); *Y10S 134/902* (2013.01)
USPC .......................................... 134/184; 134/902

(58) Field of Classification Search
USPC .................................................. 134/184, 902
See application file for complete search history.

(56) References Cited

U.S. PATENT DOCUMENTS

| | | | |
|---|---|---|---|
| 5,911,232 A | 6/1999 | Mokuo et al. | |
| 6,002,195 A * | 12/1999 | Puskas | .......................... 310/325 |
| 2004/0182414 A1 * | 9/2004 | Puskas | ................................ 134/1 |
| 2005/0284509 A1 | 12/2005 | Sakurai et al. | |

FOREIGN PATENT DOCUMENTS

| | | |
|---|---|---|
| JP | 61-143685 U | 9/1986 |
| JP | 02-4688 U | 1/1990 |
| JP | 10-135176 A | 5/1998 |
| JP | 2003-320328 A | 11/2003 |
| JP | 2006-007066 A | 1/2006 |

OTHER PUBLICATIONS

An English language International Search Report dated Oct. 23, 2007, issued in counterpart International Application No. PCT/JP2007/067581.

* cited by examiner

*Primary Examiner* — Joseph L Perrin
*Assistant Examiner* — Levon J Shahinian
(74) *Attorney, Agent, or Firm* — Holtz, Holtz, Goodman & Chick PC

(57) ABSTRACT

The invention provides an ultrasonic cleaning apparatus in which unevenness of sound pressure among a plurality of oscillating elements is solved by emitting uniform ultrasonic waves, the rate of removal of fine particles is improved, and the uneven cleaning is avoided. The ultrasonic cleaning apparatus includes a cleaning bath that stores an object to be cleaned and cleaning solvent; a plurality of oscillating elements attached to the cleaning bath; a plurality of oscillators connected respectively to the plurality of oscillating elements for exciting the plurality of oscillating elements; and a controller connected to the plurality of oscillators for controlling the plurality of oscillators to output signals having the same phase or substantially the same phase to the plurality of oscillating elements.

10 Claims, 8 Drawing Sheets

ULTRASONIC CLEANING APPARATUS

This application is a U.S. National Phase Application under 35 USC 371 of International Application PCT/JP2007/067581 filed Sep. 10, 2007.

BACKGROUND OF THE INVENTION

1. Field of the Invention

The present invention relates to an ultrasonic cleaning apparatus for cleaning an object to be cleaned stored in a cleaning bath by oscillating a plurality of oscillating elements.

2. Description of the Related Art

As an example of ultrasonic cleaning apparatuses for cleaning objects to be cleaned (for example, a semiconductor wafer or glass substrate) soaked in cleaning solvent in a cleaning bath using oscillations of oscillating elements, there is an ultrasonic cleaning apparatus 410 as shown in FIG. 8. FIG. 8 is a partly cross-sectional view showing a configuration of an ultrasonic cleaning apparatus in the related art. The ultrasonic cleaning apparatus 410 includes a cleaning bath 420a for storing cleaning solvent 421, and a plurality of oscillators 441, 442, and 443 are connected to a plurality of oscillating elements 431, 432, and 433 attached to an oscillating panel 420b bonded to the bottom surface of the cleaning bath 420a. Power sources 451, 452, and 453 for supplying electric power are connected to the oscillators 441, 442, and 443, respectively. In this ultrasonic cleaning apparatus 410, the oscillating elements 431, 432, and 433 are excited by the oscillators 441, 442, and 443, so that removal of fine particles attached to the object to be cleaned soaked in the cleaning solvent 421 in the cleaning bath 420a is achieved.

[Patent Document 1] Published utility model application No. H2-4688
[Patent Document 2] Published utility model application No. S61-143685

However, in the ultrasonic cleaning apparatus 410, since the oscillating elements 431, 432, and 433 are excited by operating the plurality of oscillators 441, 442, and 443 independently from each other, unevenness in sound pressure occurs among the oscillating elements 431, 432, and 433. Therefore, sufficient removal of the fine particles attached to the object to be cleaned cannot be achieved, and hence uneven cleaning is resulted.

SUMMARY OF THE INVENTION

Accordingly, it is an object of the invention to provide an ultrasonic cleaning apparatus in which unevenness of sound pressure among a plurality of oscillating elements is solved, and the rate of removal of fine particles is improved, and the uneven cleaning is avoided.

In order to solve the above described object, the invention provide an ultrasonic cleaning apparatus including: a cleaning bath that stores an object to be cleaned and cleaning solvent; a plurality of oscillating elements attached to the cleaning bath; a plurality of oscillators connected respectively to the plurality of oscillating elements for exciting the plurality of oscillating elements; and a controller connected to the plurality of oscillators for controlling the plurality of oscillators to output signals of the same phase to the plurality of oscillating elements.

Preferably, the plurality of oscillators output signals of the same phase which are synchronized by a synchronization pulse outputted from the controller.

Preferably, the plurality of oscillators output signals of the same phase synchronized by a synchronization pulse outputted from the controller irrespective of the operating state thereof.

Preferably, the plurality of oscillators each include a frequency control circuit, and the frequency control circuit generates a signal having a frequency according to an oscillating frequency value outputted by the controller to the plurality of oscillators, and output the signal to each of the plurality of oscillating elements as a signal of the same phase synchronized by the synchronization pulse outputted to the plurality of oscillators from the controller.

Preferably, the controller outputs an oscillation start timing pulse for causing the oscillators to start outputting signals to the oscillating elements.

Preferably, the phases of the signals synchronized by the synchronization pulse and outputted are the same zero degree.

Preferably, the oscillating elements are piezoelectric elements.

Preferably, the ultrasonic cleaning apparatus includes an indirect bath which stores a medium for propagating oscillations and the cleaning bath arranged so as to come into contact at least with the medium, an indirect bath including the plurality of oscillating elements attached thereto.

Preferably, the plurality of oscillator each include an electric power amplifying circuit, and the electric power amplifying circuit amplifies the amplitude of the signal outputted to each of the plurality of oscillating elements according to an electric power setting value signal outputted by the controller to the plurality of oscillators.

An ultrasonic cleaning apparatus according to the invention includes a cleaning bath that stores an object to be cleaned and cleaning solvent; a plurality of oscillating elements attached to the cleaning bath; a plurality of oscillators connected respectively to the plurality of oscillating elements for exciting the plurality of oscillating elements; and a controller connected to the plurality of oscillators for controlling the plurality of oscillators to output signals of substantially the same phase to the plurality of oscillating elements.

Preferably, the plurality of oscillators output signals having the same phase which are synchronized by a synchronization pulse outputted from the controller, and the phase difference of signals outputted by the plurality of oscillators is within a range from −45 degrees to +45 degrees.

Preferably, the plurality of oscillators each include a signal generation circuit, and the phase difference of signals generated by the respective signal generation circuits is within a range from −5 degrees to +5 degrees.

Preferably, the signal generated by the signal generation circuit is a FM-modulated wave.

Preferably, the FM-modulated wave is synchronized with the synchronization pulse outputted from the controller at the lowest frequency.

Preferably, the signal generated by the signal generation circuit is an AM-modulated wave.

Preferably, the AM-modulated wave is synchronized with the synchronization pulse outputted from the controller at the smallest amplitude.

According to the present invention, since the plurality of oscillators are controlled to output signals of the same phase or substantially the same phase to the plurality of oscillating elements, uniform ultrasonic waves may be emitted from the plurality of oscillating elements. Therefore, unevenness in sound pressure is avoided, removal of the fine particles attached to the object to be cleaned is ensured and, consequently, occurrence of unevenness in ultrasonic wave cleaning is prevented.

The controller outputs a frequency value (for example, frequency data such as 100 kHz, 1 MHz), an electric power setting value signal, an oscillation start timing pulse, and the synchronization pulse to the oscillators, and has no function of oscillator which requires an electric power larger than these signals. The controller is provided separately from the oscillators. Therefore, it is not necessary to increase or decrease the oscillating elements according to the number of oscillating elements, so that excitation of the plurality of oscillating elements is achieved by controlling the plurality of oscillators after having increased or decreased by a single control circuit 60.

By providing the controller separately from the main body of the ultrasonic cleaning apparatus, the ultrasonic cleaning apparatus arranged in a clean room, for example, can be controlled by the controller arranged in a room other than the clean room. Therefore, operating efficiency is improved, which is preferable in terms of management of manufacturing environment to be carried out in the clean room. Furthermore, the control of the oscillators in a plurality of ultrasonic cleaning apparatuses is also achieved by the controller, which further improves the operating efficiency.

The controller is able to output the synchronization pulse irrespective of the operating state of the oscillators. Therefore, the controller is able not only to output the synchronization pulse at the time of starting the operation of the plurality of oscillators to synchronize the phase of the output signals from the oscillators, but also to output the synchronization pulse to the plurality of oscillators to synchronize the phases of the output signals therefrom when the plurality of oscillators are already in operation or when the oscillators in operation and the oscillators in halt are mixed. Accordingly, when the plurality of oscillators are in operation, the output signals from these oscillators may be synchronized to the same phase or to substantially the same phase, so that prevention of uneven cleaning is further ensured.

Since the oscillating elements and the oscillators are provided in one-to-one correspondence, the oscillating elements are always excited sufficiently even when the cleaning conditions are changed (for example, when the ultrasound wave for excitation is changed or when the duration of cleaning is changed).

DESCRIPTION OF THE PREFERRED EMBODIMENTS

Figure 1:
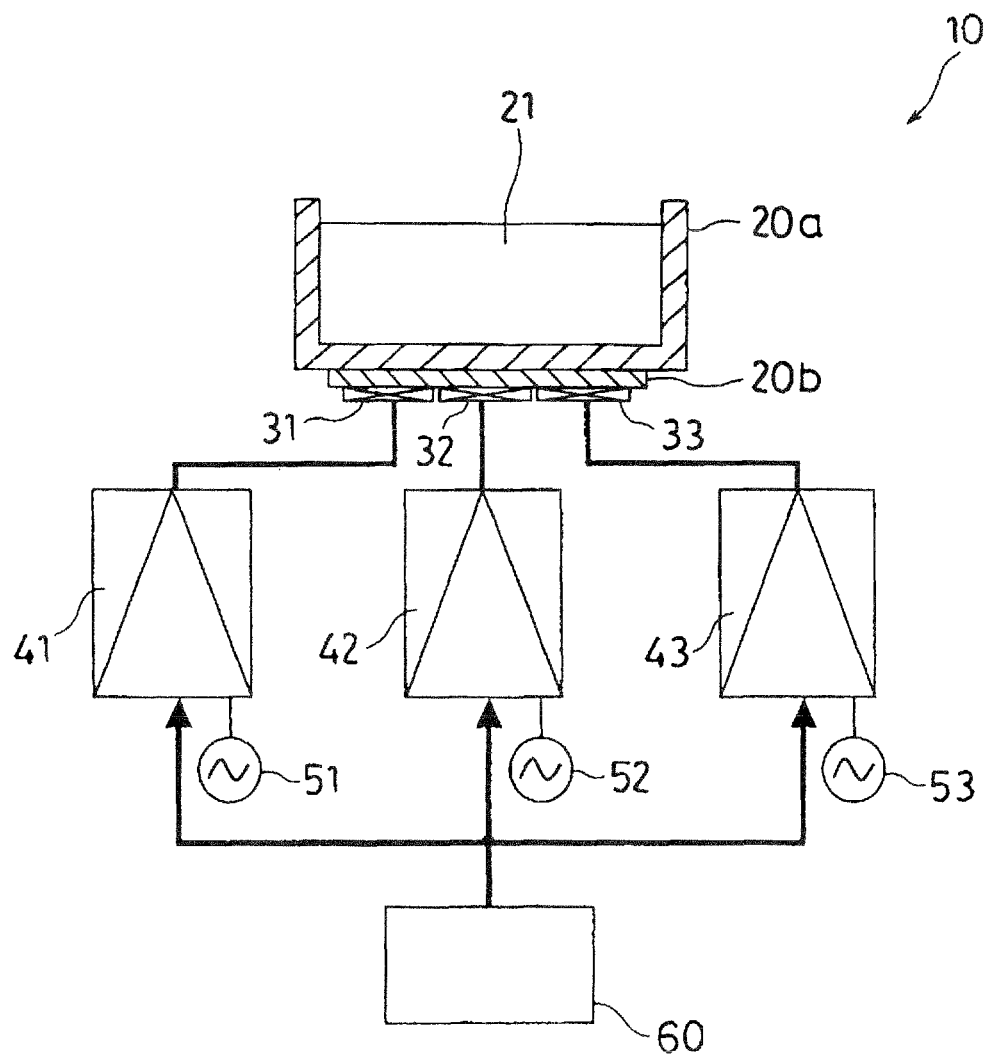
FIG. 1 is a partly cross-sectional view showing a configuration of an ultrasonic cleaning apparatus according to a first embodiment of the invention.

Referring now to the drawings, an embodiment of the invention will be described.

An ultrasonic cleaning apparatus 10 according to a first embodiment includes a cleaning bath 20a, an oscillating panel 20b, piezoelectric elements (oscillating elements) 31, 32, and 33, oscillators 41, 42, and 43, and a control circuit (controller) 60 as shown in FIG. 1. With the ultrasonic cleaning apparatus 10, phase synchronization of signals outputted from the oscillators 41, 42, and 43 for exciting the piezoelectric elements 31, 32, and 33 is achieved by control of the control circuit 60, whereby ultrasonic waves emitted from the piezoelectric elements 31, 32, and 33 to an object to be cleaned may be uniformized, so that removal of fine particles attached to the object to be cleaned is ensured. FIG. 1 is a partly cross-sectional view showing a configuration of the ultrasonic cleaning apparatus 10 according to a first embodiment.

The cleaning bath 20a may be a known bath formed of quartz, for example, and cleaning solvent 21 (for example, pure water or drug solution) is stored therein and an object to be cleaned held by holding means (not shown) is soaked therein.

The oscillating panel 20b is bonded to the bottom surface of the cleaning bath 20a, and upper surfaces of the piezoelectric elements (oscillating elements) 31, 32, and 33 formed of ceramic panels are fixedly bonded to the lower surface of the oscillating panel 20b. The piezoelectric elements 31, 32, and 33 are arranged so as to apart from each other by pitches taking the cleaning effect of the object to be cleaned, for example, at pitches from 0.1 to 0.2 mm. The kind and the number of the piezoelectric elements may be determined as desired. However, they are preferably determined by taking the size of the cleaning bath 20a and the amount of oscillation required for cleaning into consideration. Piezoelectric elements other than those in a plate shape or those formed of ceramic or elements other than the piezoelectric element may be used as the oscillating elements.

The oscillators 41, 42, and 43 which excite the piezoelectric elements 31, 32, and 33 at a predetermined frequency (for example, 18 kHz to 10 MHz) are connected to the piezoelectric elements 31, 32, and 33. The oscillators 41, 42, and 43 are each provided with a frequency control circuit and an electric power amplifying circuit (not shown). The oscillators 41, 42, and 43 are connected to commercial power sources 51, 52, and 53 for supplying electric power thereto. The oscillators 41, 42, and 43 output pulse signals having the same frequency, phase, amplitude, and waveform to the piezoelectric elements 31, 32, and 33, respectively.

The control circuit 60 as a controller controls the oscillators 41, 42, and 43 so that the oscillators 41, 42, and 43 outputs signals of the same phase to the piezoelectric elements 31, 32, and 33. Therefore, the control circuit 60 outputs a frequency value, an electric power setting value signal, an oscillation start timing pulse, and a synchronization pulse to the oscillators 41, 42, and 43. The control circuit 60 does not have to perform an action to control the oscillators 41, 42, and 43 on the basis of feedback signals from the oscillators 41, 42, and 43. However, the control circuit which is able to perform such control is also applicable.

Frequency control circuits of the oscillators 41, 42, and 43 each generate a pulse signal having a frequency according to the frequency value outputted from the control circuit 60 to the each oscillator (for example, 18 kHz to 10 MHz). These pulse signals are amplified to amplifications required for exciting the piezoelectric elements 31, 32, and 33 according to the electric power set value signal by the electric power amplifying circuits of the oscillators 41, 42, and 43, and are outputted to the corresponding piezoelectric elements.

The oscillators 41, 42, and 43 starts output of pulse signals for exciting the piezoelectric elements 31, 32, and 33 at the timing when oscillation start timing pulses are entered from the control circuit 60 in a stopped state. Accordingly, the pulse signals outputted from the oscillators 41, 42, and 43 have the same phase. Therefore, uniform ultrasonic waves are emitted from the piezoelectric elements 31, 32, and 33 to the cleaning bath 20a, so that the sound pressure generated thereby has no fluctuation and hence removal of the fine particles adhered to the object to be cleaned is ensured. Consequently, generation of fluctuations in the ultrasonic cleaning is prevented. The oscillators 41, 42, and 43 are in a standby state of being ready for outputting pulse signals according to the frequency values and the electric value setting value signals until the oscillation start timing pulses are entered.

The oscillators 41, 42, and 43 output pulse signals having the same phase (for example, zero degree) simultaneously when the synchronization pulse is entered from the control circuit 60 irrespective of the operating state thereof. The value of the phase to be the same is stored in the control circuit 60 in advance. Accordingly, emission of the uniform ultrasonic wave to the cleaning bath 20a from the piezoelectric elements 31, 32, and 33 via the oscillating panel 20b is achieved, so that the fluctuations in generated sound pressure are eliminated. Consequently, removal of the fine particles attached to the object to be cleaned is ensured, so that generation of fluctuations in ultrasonic cleaning is prevented. In particular, when the phase is adjusted by the synchronization pulse at certain time intervals, the phase difference between the output pulse signals generated by errors among quartz oscillators which generate pulses in the respective oscillator is corrected and hence the fluctuations in sound pressure are always restrained. Accordingly, prevention of generation of fluctuations in the ultrasonic cleaning is further ensured. It is also possible to output the synchronization pulse when the oscillators 41, 42, and 43 start operating to align the phase of the output signal of the oscillators thereof.

Here, for example, the cleaning bath 20a is arranged in a processing section (not shown) of the ultrasonic cleaning apparatus 10 and the oscillators 41, 42, and 43 are arranged in a control section (not shown) in the ultrasonic cleaning apparatus 10, respectively, and the control circuit 60 is arranged in an operating panel or a CPU BOX (not shown) of the ultrasonic cleaning apparatus 10 separately from the oscillators 41, 42, and 43.

The control circuit 60 outputs the frequency value, the electric power setting value signal, the oscillation start timing pulse, and the synchronization pulse to the oscillators 41, 42, and 43, and does not have a function of the oscillators 41, 42, and 43, which required an electric power larger than these signals. The control circuit 60 is separately provided from the oscillators 41, 42, and 43. Therefore, when increasing or decreasing the number of the piezoelectric elements, it is not necessary to increase or decrease the number of the control circuit 60 according to the number of piezoelectric elements, and the plurality of oscillators after increase or decrease are controlled to excite the plurality of piezoelectric elements by the single control circuit 60.

Since the piezoelectric elements 31, 32, and 33 and the oscillators 41, 42, and 43 are provided in one-to-one correspondence, the piezoelectric elements 31, 32, and 33 are always excited sufficiently even when cleaning conditions are changed (for example, when the ultrasonic wave for excitation is changed, or the duration of cleaning is changed). In contrast, when exciting the plurality of piezoelectric elements by one oscillator, the sufficient excitation becomes difficult when the number of piezoelectric elements is increased.

Figure 2:
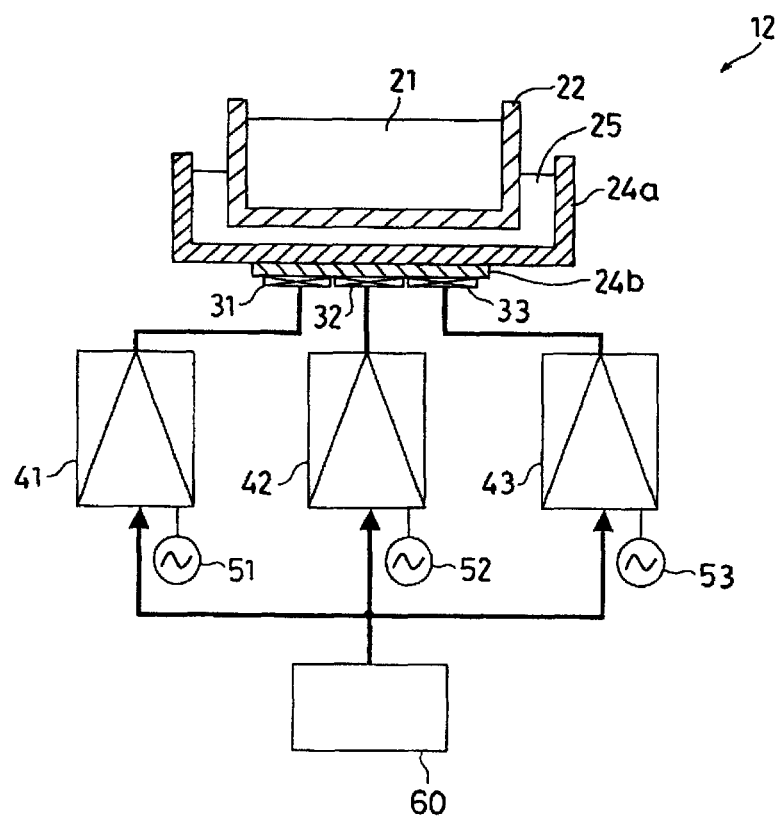
FIG. 2 is a partly cross-sectional view showing a configuration of an ultrasonic cleaning apparatus according to a second embodiment of the invention.

Referring now to FIG. 2, a second embodiment of the present invention will be described. The second embodiment is different from the first embodiment in that an indirect bath 24a is provided. Other components are the same as the first embodiment. Therefore, the same components are represented by the same reference numerals, and detailed description is omitted. FIG. 2 is a partly cross-sectional view showing a configuration of an ultrasonic cleaning apparatus 12 according to the second embodiment.

The ultrasonic cleaning apparatus 12 shown in FIG. 2 includes the piezoelectric elements 31, 32, and 33, the oscillators 41, 42, and 43, and the control circuit 60 in the same manner as the ultrasonic cleaning apparatus 10 in the first embodiment, and further includes a cleaning bath 22 and the indirect bath 24a. The cleaning bath 22 may be a known bath formed of quarts, for example, like the ultrasonic cleaning apparatus 10, and the cleaning solvent 21 (for example, pure water or drug solution) is stored therein and an object to be cleaned held by the holding means (not shown) is soaked therein.

The indirect bath 24a stores a medium 25 for propagating oscillations (for example, water, resilient substance, SUS (stainless steel), PVDF (PolyVinylidine DiFluoride), PolyTetraFluoroEthylene. The cleaning bath 22 supported by supported means (not shown) in such a manner that at least the bottom surface comes into contact with the medium 25 is disposed in the indirect bath 24a. The indirect bath 24a is formed by molding polypropylene into a rectangular frame shape, and includes a stainless steel oscillating panel 24b bonded to the bottom surface thereof. The piezoelectric elements 31, 32, and 33 are bonded to the bottom surface of the oscillating panel 24b. When an indirect bath 24 is arranged between the cleaning bath 22 and the piezoelectric elements 31, 32, and 33 in this manner, the object to be cleaned is prevented from being contaminated by the oscillating panel 24b itself or by the atmosphere when the oscillating panel 24b is broken, when the oscillating panel 24b is contaminated, or when the cleaning bath 22 is deteriorated. Other operations, effects and modifications are the same as those in the first embodiment.

Figure 3:
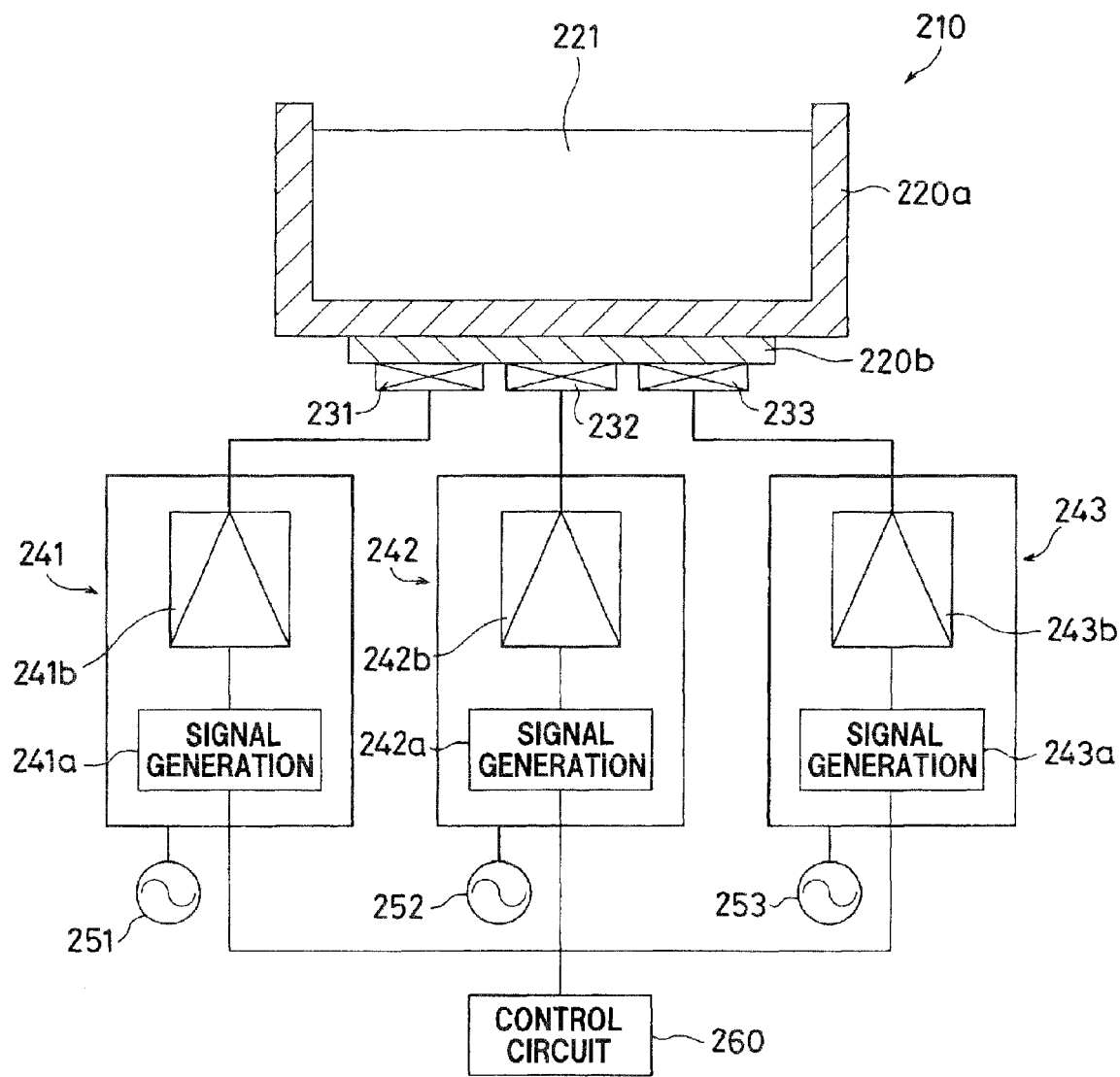
FIG. 3 is a partly cross-sectional view showing a configuration of an ultrasonic cleaning apparatus according to a third embodiment of the invention.
Figure 4:
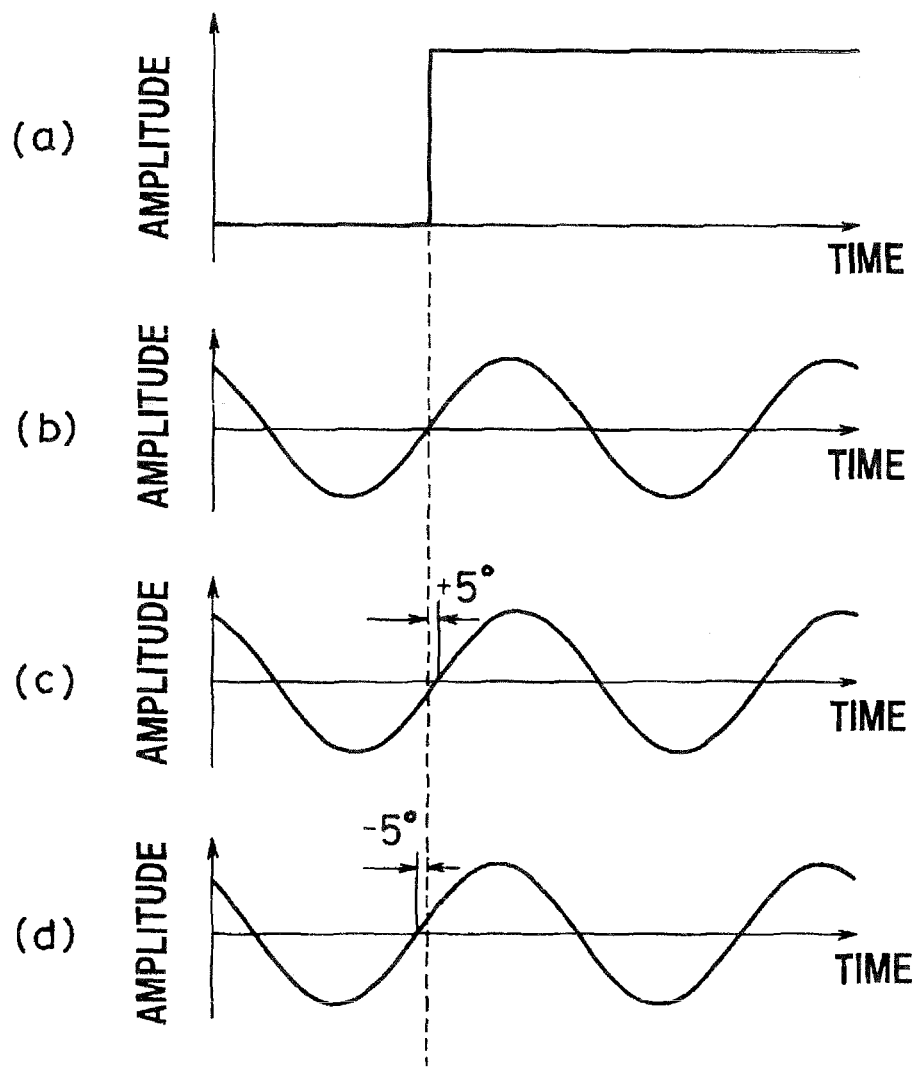
FIGS. 4A to 4D are timing charts showing the range of phase different of output signals from signal generating circuits which are allowable for a synchronization pulse from a control circuit according to the third embodiment of the invention.
Figure 5:
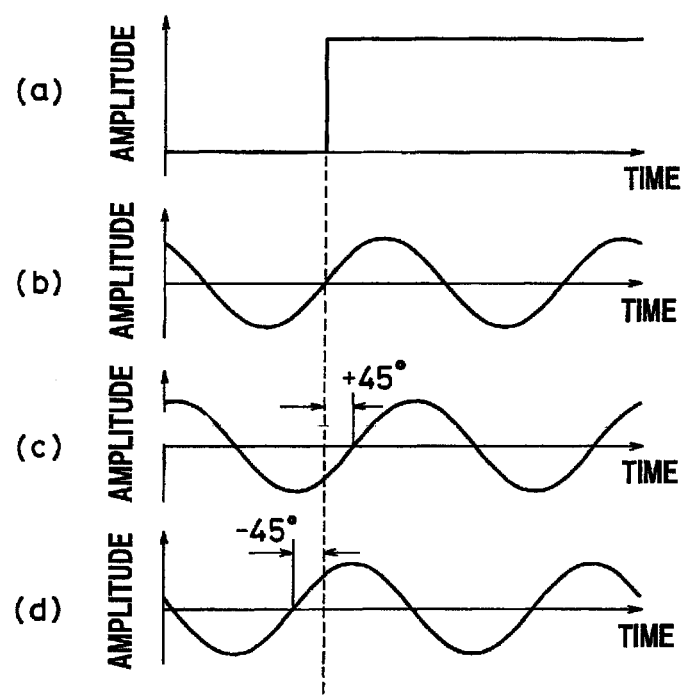
FIGS. 5A to 5D are timing charts showing the range of phase different of output signals from electric power amplifying circuits which are allowable for a synchronization pulse from a control circuit according to the third embodiment of the invention.

Referring now to FIG. 3 to FIG. 5, a third embodiment will be described in detail.

An ultrasonic cleaning apparatus 210 according to the third embodiment includes a cleaning bath 220a, an oscillating panel 220b, piezoelectric elements (oscillating elements) 231, 232, and 233, oscillators 241, 242, and 243, and a control circuit (controller) 260 as shown in FIG. 3. According to the ultrasonic cleaning apparatus 210, timings of signals outputted from the oscillators 241, 242, and 243 for exciting the piezoelectric elements 231, 232, and 233 can be matched by the control of the control circuit 260, whereby the ultrasonic waves emitted to the object to be cleaned from the piezoelectric elements 231, 232, and 233 are uniformized, and removal of the fine particles attached to the object to be cleaned is ensured. FIG. 3 is a partial cross-sectional view showing a configuration of an ultrasonic cleaning apparatus 210 according to the third embodiment.

The cleaning bath 220a may be a know bath formed of quartz, for example, and cleaning solvent 221 (for example, pure ware or drug solution) is stored therein and an object to be cleaned held by holding means (not shown) is soaked therein.

The oscillating panel 220b is bonded to the bottom surface of the cleaning bath 220a, and upper surfaces of the piezoelectric elements (oscillating elements) 231, 232, and 233 formed of ceramic panels are fixedly bonded to the lower surface of the oscillating panel 220b. The piezoelectric elements 231, 232, and 233 are arranged so as to apart from each other by pitches taking the cleaning effect of the object to be cleaned, for example, at pitches from 0.1 to 0.2 mm. The kind and the number of the piezoelectric elements may be determined as desired. However, they are preferably determined by taking the size of the cleaning bath 220a and the amount of oscillation required for cleaning into consideration. Piezoelectric elements other than those in a plate shape or those formed of ceramic or elements other than the piezoelectric element may be used as the oscillating elements.

The oscillators 241, 242, and 243 which excites the piezoelectric elements 231, 232, and 233 at a predetermined frequency (for example, 18 kHz to 10 MHz) are connected to the piezoelectric elements 231, 232, and 233.

The oscillators 241, 242, and 243 are each provided with signal generation circuits 241a, 242a, and 243a and electric power amplifying circuits 241b, 242b, and 243b. The oscillators 241, 242, and 243 are connected to commercial power sources 251, 252, and 253 for supplying electric power thereto. The oscillators 241, 242, and 243 output pulse signals having the same frequency, amplitude, waveform, and substantially the same phase to the piezoelectric elements 231, 232, and 233, respectively.

The control circuit 260 as a controller controls the oscillators 241, 242, and 243 so that the oscillators 241, 242, and 243 outputs signals of substantially the same phase to the piezoelectric elements 231, 232, and 233. Therefore, the control circuit 260 outputs a frequency value, an electric power setting value signal, an oscillation start timing pulse, and a synchronization pulse to the oscillators 241, 242, and 243. The control circuit 260 does not have to perform an action to control the oscillators 241, 242, and 243 on the basis of feedback signals from the oscillators 241, 242, and 243. However, the control circuit which is able to perform such control is also applicable.

The signal generating circuits 241a, 242a, and 243a of the oscillators 241, 242, and 243 generate a pulse signal having a frequency according to the frequency value outputted from the control circuit 260 to the each oscillator (for example, 18 kHz to 10 MHz). These pulse signals are amplified to amplifications required for exciting the piezoelectric elements 231, 232, and 233 according to the electric power set value signal by the electric power amplifying circuits 241b, 242b, and 243b of the oscillators 241, 242, and 243, and are outputted to the corresponding piezoelectric elements 231, 232, and 233.

As described above, the oscillators 241, 242, and 243 output signals of substantially the same phases by the control circuit 260. The "signals of substantially the same phases" are preferably such that signals outputted from the signal generation circuits 241a, 242a, and 243a have the phase difference within the range from −5 degrees to +5 degrees as shown in FIG. 4. By allowing the this range, the phase difference among the ultrasonic waves emitted from the respective piezoelectric elements 231, 232, and 233 does not affect the ultrasonic cleaning as long as the phase difference of the outputs from the signal generation circuits 241a, 242a, and 243a is within the range from −5 degrees to +5 degrees even when there is a difference in signal output timing among the signal generation circuits 241a, 242a, and 243a and this difference causes a difference among the phases of the signals to be applied to the piezoelectric elements 231, 232, and 233. Therefore, the ultrasonic waves without unevenness in sound pressure are emitted, and hence removal of the fine particles attached to the object to be cleaned is ensured. Consequently, occurrence of unevenness in the ultrasonic cleaning is prevented. The occurrence of uneven cleaning in the ultrasonic cleaning is caused by occurrence of unevenness in sound pressure caused by mutual cancellation of ultrasonic waves having opposite phases by being collide with each other. The uneven cleaning it apt to occur when the phase difference among the ultrasonic waves is in the range from 90 degrees to 270 degrees inclusive. Since the phases of ultrasonic waves are completely opposite when the phase difference between the ultrasonic waves is 180 degrees, occurrence of the uneven cleaning is maximized. In this case, by setting the phase difference in output from the signal generation circuits 241a, 242a, and 243a within the range from −5 degrees to +5 degrees, the outputs from the electric power amplifying circuits 241b, 242b, and 243b, described later, fall within the range from −45 degrees to +45 degrees, and hence the phase difference among the ultrasonic waves may be made to fall within 90 degrees (the range from −45 to +45 degrees). FIGS. 4A to 4D are timing charts showing the range of phase difference among the output signals from the signal generation circuits 241a, 242a, and 243a, in which the lateral axis represents the time and the vertical axis represents the amplitude. FIG. 4A shows a waveform of a synchronization pulse outputted from the control circuit 260, and FIGS. 4B to 4D show examples of output signals from the respective signal generation circuits 241a, 242a, and 243a. FIG. 4B shows a phase which matches a rising timing (dot line) of the synchronization pulse, FIG. 4C shows a phase advanced by +5 degrees with respect to the synchronization pulse, and FIG. 4D shows a phase delayed by 5 degrees (a phase of −5 degrees) with respect to the synchronization pulse, respectively.

The "signals of substantially the same phases outputted from the oscillators 241, 242, and 243" are preferably such that signals outputted from the electric power amplifying circuits 241b, 242b, and 243b have the phase difference within the range from −45 degrees to +45 degrees as shown in FIG. 5. Within this range, even when there is a difference in signal output timing (phase difference) among the electric power amplifying circuits 241b, 242b, and 243b, the phase difference among the ultrasonic waves emitted from the respective piezoelectric elements 231, 232, and 233 does not affect the ultrasonic cleaning. Therefore, the ultrasonic waves without unevenness in sound pressure are emitted, and hence removal of the fine particles attached to the object to be cleaned is ensured. Consequently, occurrence of unevenness in the ultrasonic cleaning is prevented. As described above, the occurrence of uneven cleaning in the ultrasonic cleaning is caused by occurrence of unevenness in sound pressure caused by mutual cancellation of ultrasonic waves having opposite phases by being collide with each other. The uneven cleaning it apt to occur when the phase difference among the ultrasonic waves is in the range from 90 degrees to 270 degrees inclusive. Since the phases of ultrasonic waves are completely opposite when the phase difference between the ultrasonic waves is 180 degrees, occurrence of the uneven cleaning is maximized. Therefore, by determining the outputs from the electric power amplifying circuits 241*b*, 242*b*, and 243*b* to have the phase difference within a range from −45 degrees to +45 degrees, the phase difference between the ultrasonic waves is brought within 90 degrees (within the range from −45 degrees to +45 degrees), so that the uneven cleaning caused by the occurrence of the unevenness in sound pressure may be prevented. FIG. 5 is a timing chart showing the range of phase difference among the output signals from the electric power amplifying circuits 241*b*, 242*b*, and 243*b*, which are allowable with respect to the synchronization pulse from the control circuit 260, in which the lateral axis represents the time and the vertical axis represents the amplitude. FIG. 5A shows an example of a waveform of a synchronization pulse outputted from the control circuit 260, and FIGS. 5B to 5D show examples of phases of the output signals from the respective electric power amplifying circuits 241*b*, 242*b*, and 243*b*. FIG. 5B shows a phase which matches a rising timing (dot line) of the synchronization pulse, FIG. 5C shows a phase advanced by +45 degrees with respect to the synchronization pulse, and FIG. 5D shows a phase delayed by 45 degrees (a phase of −5 degrees), respectively.

The oscillators 241, 242, and 243 start outputting pulse signals for exciting the piezoelectric elements 231, 232, and 233 at a timing when an oscillation start timing pulse is entered thereto in a stopped state. Accordingly, the pulse signals outputted from the oscillators 241, 242, and 243 have substantially the same phase. Therefore, uniform ultrasonic waves are emitted from the piezoelectric elements 231, 232, and 233 to the cleaning bath 220*a*, so that the sound pressure generated thereby has no fluctuation and hence removal of the fine particles adhered to the object to be cleaned is ensured. Consequently, generation of fluctuations in the ultrasonic cleaning is prevented. The oscillators 241, 242, and 243 are in a standby state of being ready for outputting pulse signals according to the frequency values and the electric power setting value signals until the oscillation start timing pulses are entered.

The oscillators 241, 242, and 243 output pulse signals having substantially the same phase simultaneously when the synchronization pulse is entered from the control circuit 260 irrespective of the operating state thereof. The value of the phase to be substantially the same is stored in the control circuit 260 in advance. Accordingly, emission of the uniform ultrasonic waves to the cleaning bath 220*a* from the piezoelectric elements 231, 232, and 233 via the oscillating panel 220*b* is achieved, so that the fluctuations in generated sound pressure are eliminated. Consequently, removal of the fine particles attached to the object to be cleaned is ensured, so that generation of fluctuations in ultrasonic cleaning is prevented. In particular, when the phase is adjusted by the synchronization pulse at certain time intervals after having started the oscillation, the phase difference between the output pulse signals generated by errors among quartz oscillators which generate pulses in the respective oscillator is corrected and hence the fluctuations in sound pressure are always restrained. Accordingly, prevention of generation of fluctuations in the ultrasonic cleaning is further ensured. It is also possible to output the synchronization pulse when the oscillators 241, 242, and 243 start operating to align the phase of the output signal of the oscillators thereof.

Here, for example, the cleaning bath 220*a* is arranged in a processing section (not shown) of the ultrasonic cleaning apparatus 210 and the oscillators 241, 242, and 243 are arranged in a control section (not shown) in the ultrasonic cleaning apparatus 210, respectively, and the control circuit 260 is arranged in an operating panel or a CPU BOX (not shown) of the ultrasonic cleaning apparatus 210 separately from the oscillators 241, 242, and 243.

The control circuit 260 outputs the frequency value, the electric power setting value signal, the oscillation start timing pulse, and the synchronization pulse to the oscillators 241, 242, and 243, and does not have a function of the oscillators 241, 242, and 243, which required an electric power larger than these signals. The control circuit 260 is separately provided from the oscillators 241, 242, and 243. Therefore, when increasing or decreasing the number of the piezoelectric elements, it is not necessary to increase or decrease the number of the control circuits 260 according to the number of the piezoelectric elements, and the plurality of oscillators after increase or decrease are controlled to excite the plurality of piezoelectric elements by the single control circuit 260.

Since the piezoelectric elements 231, 232, and 233 and the oscillators 241, 242, and 243 are provided in one-to-one correspondence, the piezoelectric elements 231, 232, and 233 are always excited sufficiently even when cleaning conditions are changed (for example, when the ultrasonic waves for excitation are changed, or the duration of cleaning is changed). In contrast, when exciting the plurality of piezoelectric elements by one oscillator, the sufficient excitation becomes difficult when the number of piezoelectric elements is increased.

Figure 6:
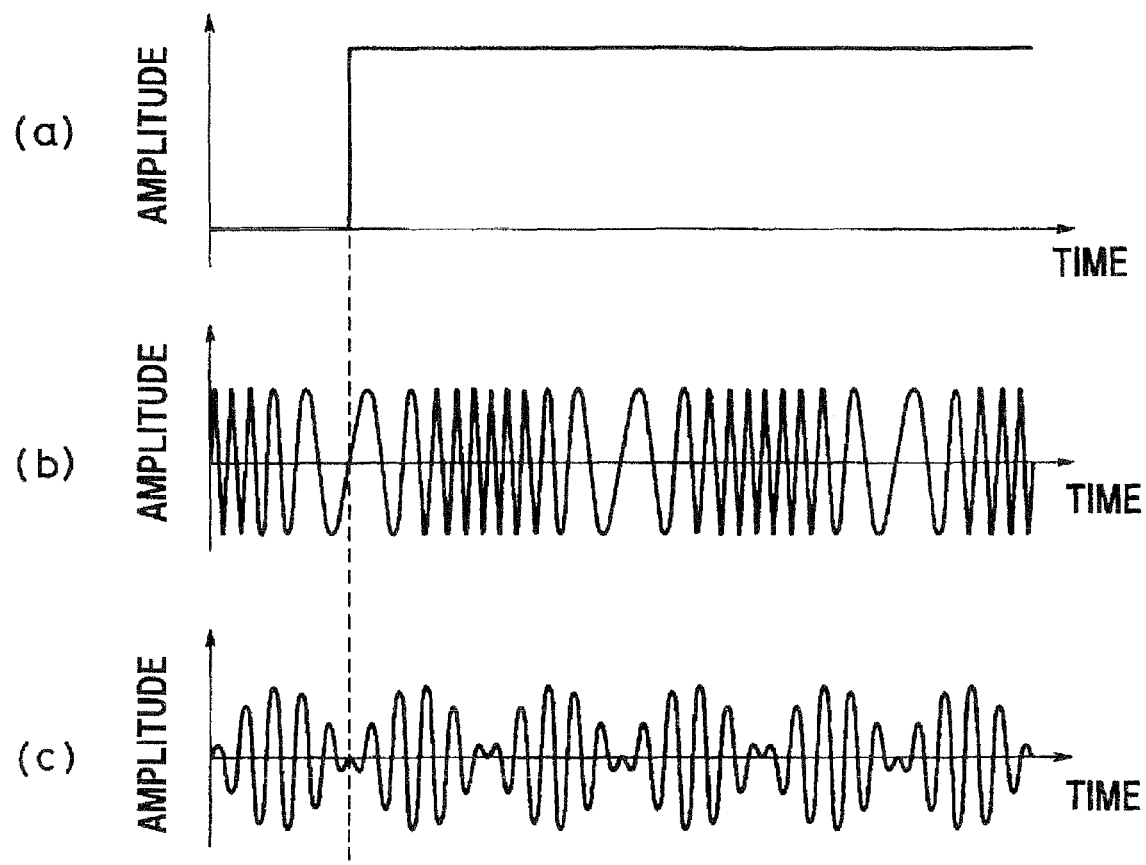
FIGS. 6A to 6C are timing charts showing a synchronizing pulse from the control circuit and output signals from the signal generating circuits according to a modification of the third embodiment of the invention.

Referring now to FIGS. 6A to 6C, a modification of the third embodiment will be described. This modification may be applied to the first embodiment and the second embodiment. FIGS. 6A to 6C are timing charts showing a synchronization pulse from the control circuit 260 and output signals from the signal generation circuit. FIG. 6A shows a waveform of the synchronization pulse outputted from the control circuit 260, FIG. 6B shows a FM-modulated output signal from the signal generation circuits 241*a*, 242*a*, and 243*a*, and FIG. 6C shows an AM modulated output signal from the signal generation circuits 241*a*, 242*a*, and 243*a*, respectively.

In this modification, modulated signals are outputted from the signal generation circuits 241*a*, 242*a*, and 243*a* instead of sine waves as shown in FIG. 4 or 5. The modulation includes, for example, the FM modulation (frequency modulation) as shown in FIG. 6B and the AM modulation (amplitude modulation) as shown in FIG. 6(C).

Signals outputted from the signal generation circuits 241*a*, 242*a*, and 243*a* synchronized with the synchronization pulse from the control circuit 260 at an adequate timing according to the type of modulation. In the FM modulation, as shown in FIG. 6B, synchronization with the synchronization pulse from the control circuit 260 may be achieved at the lowest frequency. However, synchronization at other frequencies is also possible. For example, by synchronizing at the timing according to the type of modulation as in the case of synchronizing at the lowest frequency, occurrence of uneven cleaning is prevented even though the phases are substantially the same since the synchronization is achieved at the timings of different frequencies. In this manner, in the case of FM modulation, the range of the phase difference allowable for the outputs from the respective signal generation circuits 241*a*, 242*a*, and 243*a* is preferably from −5 degrees to +5 degrees as in the case of the third embodiment. The range of phase difference allowable for the outputs from the respective electric power amplifying circuits 241*b*, 242*b*, and 243*b* is preferably from −45 degrees to +45 degrees.

When the outputs from the signal generation circuits 241*a*, 242*a*, and 243*a* are AM-modulated, the synchronization with the synchronization pulse from the control circuit 260 is achieved, for example, at the smallest amplitude as shown in FIG. 6C. However, the synchronization at other amplitudes is also possible. For example, by synchronizing at the adequate timing according to the type of modulation as in the case of synchronizing at the smallest amplitude, occurrence of uneven cleaning is prevented even though the phases are substantially the same since the synchronization is achieved at the timings of different amplitudes. In this manner, in the case of AM modulation, the range of the phase difference allowable for the outputs from the respective signal generation circuits 241a, 242a, and 243a is preferably from −5 degrees to +5 degrees as in the case of the FM modulation, and the range of phase difference allowable for the outputs from the respective electric power amplifying circuits 241b, 242b, and 243b is preferably from −45 degrees to +45 degrees.

Figure 7:
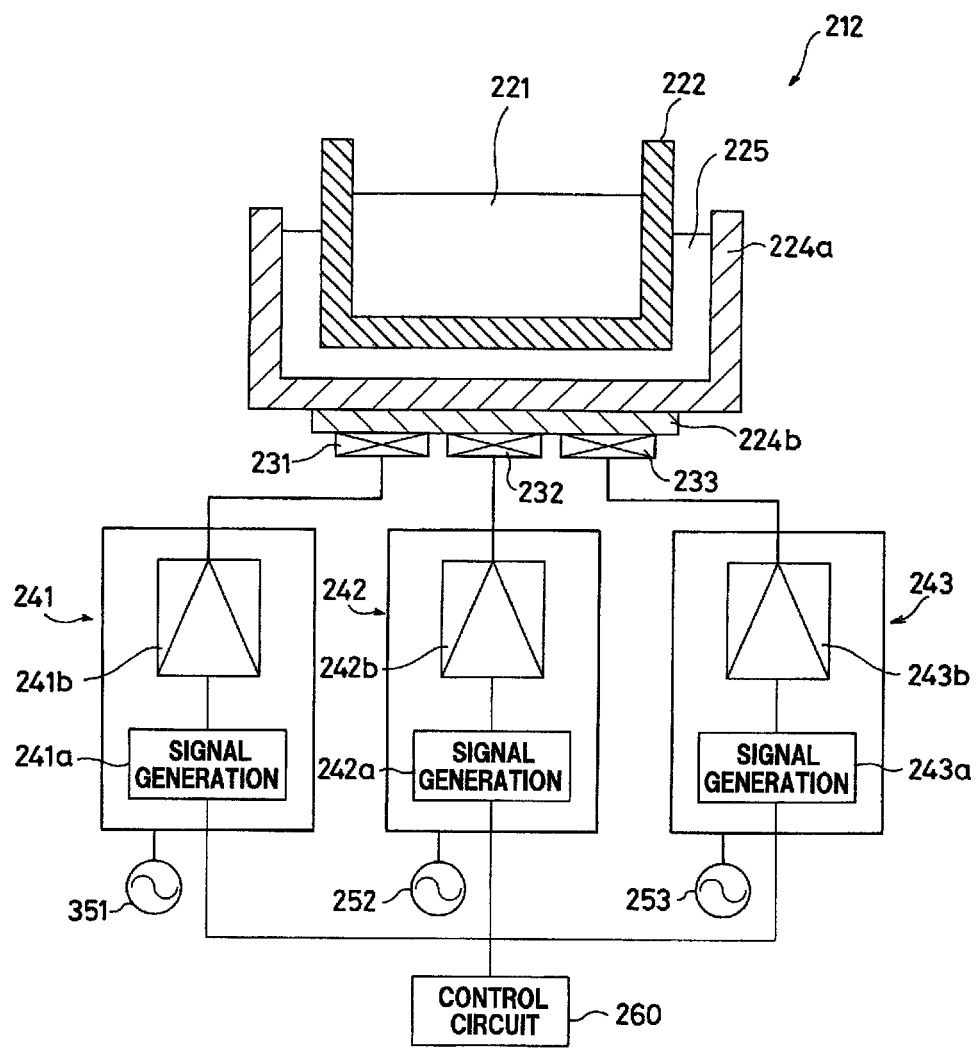
FIG. 7 is a partly cross-sectional view showing a configuration of an ultrasonic cleaning apparatus according to a fourth embodiment of the invention.
Figure 8:
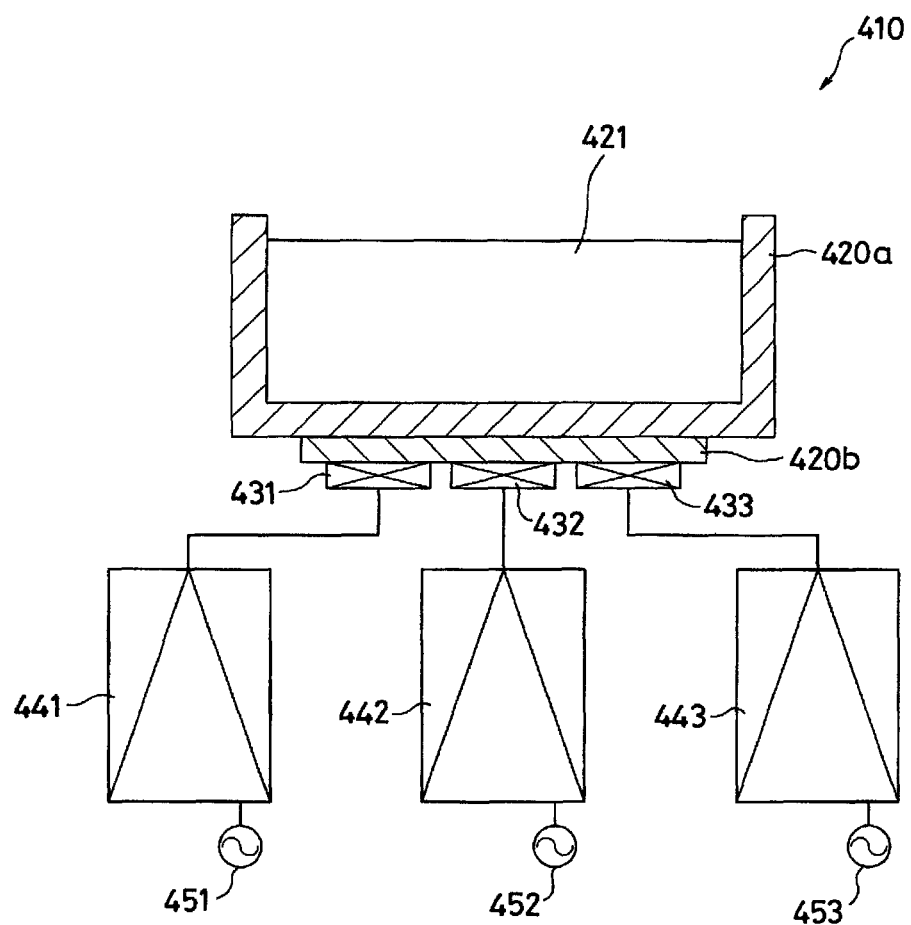
FIG. 8 is a partly cross-sectional view showing a configuration of an ultrasonic cleaning apparatus in the related art.

Referring now to FIG. 7, a fourth embodiment of the present invention will be described. The fourth embodiment is different from the third embodiment in only that a indirect bath 224a is provided. Other components are the same as the third embodiment. Therefore, the same components are represented by the same reference numerals, and detailed description is omitted. FIG. 7 is a partly cross-sectional view showing a configuration of an ultrasonic cleaning apparatus 212 according to the fourth embodiment.

The ultrasonic cleaning apparatus 212 shown in FIG. 7 includes the piezoelectric elements 231, 232, and 233, the oscillators 241, 242, and 243, and the control circuit 260 in the same manner as the ultrasonic cleaning apparatus 210 in the third embodiment, and further includes a cleaning bath 222 and the indirect bath 224a. The cleaning bath 222 may be a known bath formed of quartz, for example, like the ultrasonic cleaning apparatus 210, and the cleaning solvent 221 (for example, pure water or drug solution) is stored therein and an object to be cleaned held by the holding means (not shown) is soaked therein. As in the third embodiment, the oscillators 241, 242, and 243 includes signal generation circuits 241a, 242a, and 243a and electric power amplifying circuits 241b, 242b, and 243b, respectively.

The indirect bath 224a stores a medium 225 for propagating oscillations (for example, water, resilient substance, SUS (stainless steel), PVDF (PolyVinylidine DiFluoride), Poly-TetraFluoroEthylene. The cleaning bath 222 supported by supported means (not shown) in such a manner that at least the bottom surface comes into contact with the medium 225 is disposed in the indirect bath 224a. The indirect bath 224a is formed by molding polypropylene into a rectangular frame shape, and includes a stainless steel oscillating panel 224b bonded to the bottom surface thereof. The piezoelectric elements 231, 232, and 233 are bonded to the bottom surface of the oscillating panel 224b. When the indirect bath 224 is arranged between the cleaning bath 222 and the piezoelectric elements 231, 232, and 233 in this manner, the object to be cleaned is prevented from being contaminated by the oscillating panel 224b itself or by the atmosphere when the oscillating panel 224b is broken, when the oscillating panel 224b is contaminated, or when the cleaning bath 222 is deteriorated. Other operations, effects and modifications are the same as those in the third embodiment.

The invention has been described referring to the embodiments shown above. However, the invention is not limited to the embodiments shown above, and improvements and modifications may be made within the scope of the object and sprit of the invention.

What is claimed is:
1. An ultrasonic cleaning apparatus comprising:
a cleaning bath that stores an object to be cleaned and cleaning solvent;
a plurality of oscillating elements attached to the cleaning bath;
a plurality of oscillators connected respectively to the plurality of oscillating elements for exciting the plurality of oscillating elements, wherein each of the plurality of oscillators is respectively provided with a signal generation circuit which generates a signal and an electric power amplifying circuit which amplifies and outputs the signal generated by the signal generation circuit to a corresponding one of the plurality of oscillating elements to excite said corresponding one of the plurality of oscillating elements;
a plurality of power sources which are respectively connected to the plurality of oscillators for supplying electric power to the plurality of oscillators; and
a single controller which is connected to the plurality of signal generation circuits of the plurality of oscillators and which controls the plurality of signal generation circuits to output signals of substantially a same phase to the plurality of oscillating elements by outputting a synchronization pulse to the plurality of signal generation circuits so as to synchronize the signals outputted from the plurality of signal generation circuits;
wherein the single controller which is connected to the plurality of signal generation circuits of the plurality of oscillators outputs an oscillation start timing pulse, and outputs the synchronization pulse at certain time intervals irrespective of an operating state of the oscillators after having started the oscillation.

2. The ultrasonic cleaning apparatus according to claim 1, wherein the phases of the signals synchronized by the synchronization pulse and outputted from the oscillators have a same degree of zero.

3. The ultrasonic cleaning apparatus according to claim 1, wherein the oscillating elements comprise piezoelectric elements.

4. The ultrasonic cleaning apparatus according to claim 1, wherein a phase difference of the signals, which are generated by the respective signal generation circuits, is within a range from −5 degrees to +5 degrees.

5. The ultrasonic cleaning apparatus according to claim 1, wherein the signal generated by the signal generation circuit is a frequency modulated wave.

6. The ultrasonic cleaning apparatus according to claim 5, wherein the frequency modulated wave is synchronized with the synchronization pulse outputted from the controller at a lowest frequency.

7. The ultrasonic cleaning apparatus according to claim 1, wherein the signal generated by the signal generation circuit is an amplitude modulated wave.

8. The ultrasonic cleaning apparatus according to claim 7, wherein the amplitude modulated wave is synchronized with the synchronization pulse outputted from the controller at a smallest amplitude.

9. An ultrasonic cleaning apparatus comprising:
a cleaning bath that stores an object to be cleaned and cleaning solvent;
an indirect bath which stores a medium for propagating oscillations, the cleaning bath being arranged so as to come into contact at least with the medium;
a plurality of oscillating elements attached to the indirect bath;
a plurality of oscillators connected respectively to the plurality of oscillating elements for exciting the plurality of oscillating elements, wherein each of the plurality of oscillators is respectively provided with a signal generation circuit which generates a signal and an electric power amplifying circuit which amplifies and outputs the signal generated by the signal generation circuit to a corresponding one of the plurality of oscillating elements to excite said corresponding one of the plurality of oscillating elements;

a plurality of power sources which are respectively connected to the plurality of oscillators for supplying electric power to the plurality of oscillators; and a single controller which is connected to the plurality of signal generation circuits of the plurality of oscillators and which controls the plurality of signal generation circuits to output signals of a substantially same phase to the plurality of oscillating elements by outputting a synchronization pulse to the plurality of signal generation circuits so as to synchronize the signals outputted from the plurality of signal generation circuits;

wherein the single controller which is connected to the plurality of signal generation circuits of the plurality of oscillators outputs an oscillation start timing pulse, and outputs the synchronization pulse at certain time intervals irrespective of an operating state of the oscillators after having started the oscillation.

10. An ultrasonic cleaning apparatus comprising:

a cleaning bath that stores an object to be cleaned and cleaning solvent;

a plurality of oscillating elements attached to the cleaning bath;

a plurality of oscillators connected respectively to the plurality of oscillating elements for exciting the plurality of oscillating elements, wherein each of the plurality of oscillators is respectively provided with a signal generation circuit which generates a signal and an electric power amplifying circuit which amplifies and outputs the signal generated by the signal generation circuit to a corresponding one of the plurality of oscillating elements to excite said corresponding one of the plurality of oscillating elements;

a plurality of power sources which are respectively connected to the plurality of oscillators for supplying electric power to the plurality of oscillators; and a single controller which is connected to the plurality of signal generation circuits of the plurality of oscillators and which controls the plurality of signal generation circuits to output signals of a substantially same phase to the plurality of oscillating elements by outputting a synchronization pulse to the plurality of signal generation circuits so as to synchronize the signals outputted from the plurality of signal generation circuits;

wherein a phase difference of the signals outputted by the plurality of oscillators is within a range from −45 degrees to +45 degrees; and wherein the single controller which is connected to the plurality of signal generation circuits of the plurality of oscillators outputs an oscillation start timing pulse, and outputs the synchronization pulse at certain time intervals irrespective of an operating state of the oscillators after having started the oscillation.

* * * * *